United States Patent [19]

Tamor et al.

[11] Patent Number: 5,425,965
[45] Date of Patent: Jun. 20, 1995

[54] PROCESS FOR DEPOSITION OF ULTRA-FINE GRAINED POLYCRYSTALLINE DIAMOND FILMS

[75] Inventors: Michael A. Tamor, Toledo, Ohio; Timothy J. Potter, Dearborn; Ching-Hsong Wu, Farmington Hills, both of Mich.

[73] Assignee: Ford Motor Company, Dearborn, Mich.

[21] Appl. No.: 172,969

[22] Filed: Dec. 27, 1993

[51] Int. Cl.$^6$ ............................................. C23C 16/00
[52] U.S. Cl. ................................. 427/249; 427/600; 423/446
[58] Field of Search ............... 427/249, 600; 423/446; 156/DIG. 68

[56] References Cited

U.S. PATENT DOCUMENTS

| | | | |
|---|---|---|---|
| 4,925,701 | 5/1990 | Jansen et al. | 427/249 |
| 5,082,359 | 1/1992 | Kirkpatrick | 423/446 |
| 5,106,452 | 4/1992 | Kadono et al. | 423/446 |
| 5,146,481 | 9/1992 | Garg et al. | 423/446 |
| 5,185,179 | 2/1993 | Yamazaki et al. | 427/601 |

OTHER PUBLICATIONS

Masood et al., "Techniques for Patterning of CVD Diamond Films on Non-Diamond Substrates," J. Electrochem vol. 138, No. 11 Nov. 1991, pp. L67–L68.

The Condensed Chemical Dictionary, 10th Ed., 1981, p. 541.

"Growth of Diamond Particles in Chemical Vapor Deposition", Iijima et al, J. Mater. Res. vol. 6, No. 7, Jul. 1991.

"Surface Treatment for Enhanced Nucleation of Diamond", Svend S. Eskildsen, Danish Technical Inst., 2nd International Conference on the Application of Diamond Films & Related Materials, 1993.

*Primary Examiner*—Shrive Beck
*Assistant Examiner*—David Maioran
*Attorney, Agent, or Firm*—Lorraine S. Melotik; Roger L. May

[57] ABSTRACT

This invention is directed to a method for enhancing the diamond nucleation on a substrate prior to providing a diamond film thereon. More particularly, it is directed to a method which involved ultrasonic treatment of the substrate surface with a fluid consisting essentially of unsaturated oxygen-free hydrocarbons and diamond grit.

13 Claims, No Drawings

PROCESS FOR DEPOSITION OF ULTRA-FINE GRAINED POLYCRYSTALLINE DIAMOND FILMS

FIELD OF THE INVENTION

This invention relates to a method for enhancing the diamond nucleation on substrate surfaces prior to providing a diamond film thereon. More particularly, it is directed to a method which involves ultrasonic treatment of the substrate surface with a fluid containing diamond grit.

BACKGROUND OF THE INVENTION

With its superior hardness, transparency, thermal conductivity and chemical stability, diamond would be the material of choice for a vast array of components for tribological or high-stress optical applications. Applications range from relatively mundane tooling for machining of abrasive materials such as metal-matrix composites to windows and optical objectives for ultra-high velocity missiles and aircraft. Until recently, actual applications of diamond has been limited to those which may be satisfied by optically poor but relatively cheap sintered polycrystalline diamond compact (PCD) or sections cut from large, and therefore extremely expensive, diamond crystals. Such applications are further limited to shapes and configurations which may be produced from such "bulk" materials. Over the last decade, rapid advances in the technology of chemical vapor deposition (CVD) of diamond in the form of films and coatings has opened the range of diamond applications. Using the CVD methods an object of almost any shape may be coated with diamond so long as the material itself can survive the conditions required for diamond CVD. Some examples of new applications include high frequency loudspeakers, complex cutting tools, dies, drills, reamers and taps, X-ray transparent vacuum windows, abrasion resistant objectives for military optical systems and heat extraction for super-high density electronic circuits.

Although physical survival in the diamond growth environment is the primary criterion for a substrate suitable for diamond coating, a second criteria is that diamond nucleate on and adhere to the surface. Diamond nucleates most readily on diamond itself. Diamond also nucleates on cubic boron-nitride, which is even less available than diamond, and to a lesser extent some carbides (boron-carbide, silicon-carbide and tungsten carbide). Therefore, for most practical applications, some sort of pretreatment to promote diamond nucleation is necessary. Several methods for enhancing diamond nucleation have been demonstrated. These fall into three broad categories: (1) in-situ (meaning in the growth reactor) bombardment with hydrocarbon ions (as demonstrated by Stoner and Glass), (2) direct dispersal of find diamond grit by spray- or spin-coating (U.S. Pat. No. 4,925,701 or Massood et al. 1991), and (3) physical abrasion by diamond particles by mechanical contact (scratching or polishing) or bombardment by ultrasonic agitation of diamond grit suspended in a suitable fluid. The first appears to be limited to crystalline silicon substrates, while the second is suitable only for nearly flat or simply shaped objects. In the third category, physical scratching is also limited to simple shapes determined by the medium (e.g. sandpaper) which carries the diamond abrasive, is often inconsistent and can physically damage the substrate. The ultrasonic bombardment method has grown in popularity because it is gentler, suitable to virtually any substrate material or shape, and is very reproducible. In all published descriptions of this method we are aware of the suspending liquid has been described as simple water or a heavy alcohol, usually isopropanol. Although higher densities are occasionally reported, typical nucleation densities of the order $10^8$ nuclei/cm$^2$ are generally obtained and are sufficient for many applications. However, if an extremely smooth, fine-grained film, or a very thin film free of microscopic pin-holes is desired, much higher densities must be achieved consistently. Furthermore, for some substrates an increased density of nuclei translates into superior film adhesion. It is desirable, therefore, to use a pretreatment process for enhancement of diamond nucleation which can readily produce $10^{11}$ nuclei/cm$^2$ on a substrate of arbitrary shape and size without macroscopic damage. The present invention provides such a pretreatment method for diamond nucleation.

DESCRIPTION OF THE INVENTION

This invention is directed to a method for enhancing diamond nucleation on the surface of a substrate. The method comprises (1) providing a fluid consisting essentially of oxygen-free hydrocarbons, at least a portion of the hydrocarbons being unsaturated oxygen-free hydrocarbons, (2) immersing the substrate in the fluid, (3) adding diamond grit to the fluid, the size of the grit being compatible with the viscosity of the fluid so that the diamond grit is capable of being maintained substantially suspended in the fluid, and (4) agitating the fluid containing the diamond grit and substrate using ultrasonic techniques for a time sufficient to allow diamond nucleation to take place on the surface of the substrate. The fluid may further comprise oxygen-free saturated hydrocarbons. The agitation step may be begun prior to the step of adding the diamond grit to the fluid. According to another embodiment of the invention, it is directed to a method for depositing a film of diamond on the method of a substrate which comprises subjecting the substrate to a method for enhancing diamond nucleation as disclosed above, removing the substrate from the fluid bath, rinsing the substrate, and then coating the substrate with a diamond film.

Advantageously, the method for enhancing the diamond nucleation disclosed above has been shown to reliably produce nucleation densities of about $10^{11}$ cm$^2$ without detectable damage even to highly polished surfaces such as that of an integrated circuit-grade silicon wafer.

As disclosed above, the invention in one embodiment relates to a method for enhancing diamond nucleation on the surface of a substrate. The substrate is composed of any material that would benefit from enhanced diamond nucleation prior to providing a coating of diamond thereon. It includes such materials as, but is not limited to, silicon, boron-carbide, silicon-carbide, tungsten carbide, boron-nitride, silicon-nitride, silicon-oxynitride (SiAlON), Titanium-nitride, titanium-carbide, titanium carbo-nitride, silicon-dioxide (glass, fused and crystalline quartz). In this invention, the term "oxygen-free hydrocarbons" is meant to refer to hydrocarbons having no oxygen atoms in their chemical structure. According to the method, a fluid bath, i.e., a fluid in a container, is provided wherein the fluid consists essentially of oxygen-free hydrocarbons, at least a portion of the hydrocarbons being unsaturated oxygen-free hydrocarbons. The bath generally will also comprise saturated oxygen-free hydrocarbons. It has been found that in order to achieve the high nucleation densities characteristic of the present invention, it is necessary to use unsaturated oxygen-free hydrocarbons. The saturated oxygen-free hydrocarbons are employed to control the viscosity of the fluid in order to keep the diamond grit in suspension.

Exemplary of oxygen-free hydrocarbons which may be employed in the method of this invention are: chain molecules with two double bonds; 1,5 hexadiene, 1,6-heptadiene, 1,7 ocatadiene, 1,8-nonadiene, 1,10 decadiene, chain molecules with one double bond; 1-hexadecene, 1-heptadecen, 1-octadecene, 1-nonadecene, 1-decadecene, molecules containing phynyl groups; benzene, toluene, xylene, trimethyl benzene, biphenyl, and mixtures thereof. Given that larger unsaturate molecules may contain both double bonds and phenyl structures, the number of possibilities is effectively infinite. Exemplary of saturated oxygen-free hydrocarbons suitable for use in the present invention are alkanes; hexane, heptane octane, nonance, decane, methyl-alkanes; methyl hexane, dimethyl hexane, methyl-octaine, dimethyl-octane, and ring molecules such as decahydroanapthalene (bicylclohexane). Again, the possibilities is effectively infinite. The preferred oxygen-free hydrocarbons employed in this invention are (unsaturated) 1,7-octadiene and benzene, and (saturated) decane and decahydronapthalene. Still other oxygen-free hydrocarbons suitable for use in the present invention will be apparent to those skilled in the art in view of the present disclosure. The preferred oxygen-free hydrocarbons to be employed in this invention comprise: (unsaturated) 1, 7-octadiene, and benzene, and (saturated) decane and, decahydronaphthalene.

As disclosed above, diamond grit is added to the fluid, the size of the diamond grit being compatible with the viscosity of the fluid so that the diamond grit is capable of being maintained substantially suspended in the fluid during the agitation of the fluid. Typically, the size of the diamond grit is between about 0.2 and $4\mu$, although not limited to this range. For 0.2 to $4\mu$ diamond grits, optimal fluid viscosity appears to be in the range of 0.2 to 1.5 cp. As would be appreciated, smaller grit size is less likely to abrade the surface of the substrate and hence more desirable in providing nucleation on substrate such as circuit-grade silicon wafers. In general, very low molecular weight fluids cannot maintain diamond in suspension and tend to evaporate rapidly during agitation, while too high a molecular weight often translates to fluids of unsuitably high viscosity. Within these limitations, however, the number of alternative fluid formulations is essential infinite. The arrhenius formula for determining mixture viscosity can be used to calculate the fluid's viscosity, the original requirement being that any fluid mixture chosen have a viscosity sufficient to keep the chosen diamond grit in suspension. For example, a mixture 45% benzene and 55% 1, 5-hexadiene will have the same viscosity as does a preferred mixture consisting of $\frac{1}{3}$ decahydronaphthalene (or decalin, $C_{10}H_{18}$, viscosity 2.7 centipoids (cp)) and $\frac{2}{3}$ 1,7-ocatadiene ($C_8H_{14}$, viscosity 0.4 cp). Another mixture that would also have the same viscosity is 10% 1,5-hexadiene and 90% decane. These mixtures have a viscosity of about 0.75 cp. These types of mixtures can be optimized for use with a relatively small grit size (0.2 microns) as preferred to minimize abrasion damage of the substrate during agitation. They are, however, usable with grits up to roughly 4 microns, above which the formulation must be modified to provide higher viscosity fluids to keep the larger grits in suspension during fluid bath agitation.

According to the method of the invention, the substrate may be placed in a bath containing the fluid or be placed in the bath and thereafter the fluid is added to the bath. Preferably, the amount of diamond grit employed in the invention is about 0.1 grams for each 30 cc of fluid. The substrate in contact with the fluid bath is agitated for a period of time using ultrasonic techniques to allow diamond nucleation to take place on the surface of the substrate. The rate of formation of nuclei is not constant and much shorter times, as short as five minutes for example, may be used with only a moderate decrease in nucleation density. If the fluid bath has been placed in a commercial ultrasonic cleaner in order to supply the agitation necessary for nucleation, care must be taken to prevent water from the ultrasonic bath from splashing into the hydrocarbon fluid. The fluid is generally used unheated, but tends to warm-up for example to as high as 50° C under energetic agitation. After nucleation has taken place to the desired extent as determined by experience with the chosen method for diamond growth, the substrate is removed from the bath and preferably ultrasonicly cleaned in acetone and methanol, to remove residual hydrocarbon fluids and adherent diamond grit. Microscopic examination did not reveal any diamond particles adherent to the substrate surface after the nucleation process and cleaning of the substrate. This is in contrast to methods using larger diamond grits suspended in oxygen-containing propanol which leave a residue of microscopic diamond flakes and noticeably dull the finish of highly polished surfaces. The substrate would now be ready to be coated with a diamond film according to any of a number of well known techniques including chemical vapor deposition (CVD), of diamond, including but not limited to: combustion synthesis, hot-filament assisted CVD, RF and microwave assisted CVD, DC arc and glow discharge assisted CVD, and laser-assisted CVD.

Without being bound by any particular theory, we propose that this process is a tribochemical deposition of heavily cross-linked carbon structures, or even sub-microscopic diamonds consisting of only a few atoms, suitable for diamond nucleation. The tribochemical process is driven by the microscopic mechanical stresses and pressures and high local temperature where a diamond particle impacts the substrate surface. We believe that ultrasonic bombardment in an appropriate fluid can produce instantaneous conditions similar to the diamond growth environment, resulting in formation of local carbon structure suitable for diamond nucleation at the points of particle impact. We believe that just as for diamond CVD, the absence of carbon, as in water, stops the nucleation process while too much oxygen, as in alcohol, does likewise.

We claim:

1. A method for enhancing diamond nucleation on the surface of a substrate, which method comprises:
   providing a fluid bath consisting essentially of oxygen-free hydrocarbons, at least a portion of said hydrocarbons being unsaturated oxygen-free hydrocarbons;
   immersing said substrate in said fluid bath;
   adding diamond grit to said fluid bath, the size of said diamond grit being compatible with the viscosity of said fluid so that said diamond grit is maintained substantially suspended in said fluid during agitation; and agitating said fluid containing said diamond grit and said substrate using ultrasonic techniques for a time sufficient to allow diamond nucleation to take place on the surface of said substrate.

2. The method according to claim 1, wherein said unsaturated oxygen-free hydrocarbons are selected from the group consisting of benzene, 1,5-hexadiene, 1,7-octadiene, and mixtures thereof.

3. The method according to claim 1, wherein said fluid further comprises saturated oxygen-free saturated hydrocarbons.

4. The method according to claim 3, wherein said saturated oxygen-free hydrocarbons are selected from the group consisting of decahydronaphthalene, decalin, cyclohexane, hexane, decane, and mixtures thereof.

5. The method according to claim 1, wherein said diamond grit size is between about 0.2 and 4$\mu$.

6. The method according to claim 1, wherein said substrate is selected from materials consisting of silicon, boron-nitride, boron-carbide, silicon, boron-carbide, silicon-carbide, tungsten carbide, boron-nitride, silicon-nitride, silicon-oxy-nitride (SiA10N), Titanium-nitride, titanium-carbide, titanium carbo-nitride, and silicon-dioxide.

7. The method according to claim 1, wherein said substrate is subjected to said agitation for a time period up to about 30 minutes.

8. The method according to claim 1, wherein said agitation step is begun prior to said step of adding said diamond grit.

9. The method according to claim 1, wherein prior to said substrate being immersed in said fluid it is subjected to cleaning with detergent, acetone and methanol.

10. The method according to claim 1 comprising the further steps of subsequently removing said substrate from said fluid, rinsing said substrate in acetone, and subjecting said substrate to acetone and then methanol in an ultrasound baths.

11. A substrate having a surface with enhanced diamond nucleation prepared according to claim 1.

12. A method for depositing a film of diamond on the surface of a substrate which comprises:
providing a fluid bath consisting essentially of oxygen-free hydrocarbons, at least a portion of said hydrocarbons being unsaturated oxygen-free hydrocarbons;
immersing said substrate in said fluid;
adding diamond grit to said fluid, the size of said diamond grit being compatible with the viscosity of said fluid so that said diamond grit is maintained substantially suspended in said fluid during agitation;
agitating said fluid containing said diamond grit and said substrate using ultrasonic techniques for a time sufficient to allow diamond nucleation to take place on the surface of said substrate;
removing said substrate from said fluid bath;
rinsing said substrate; and
coating said substrate with a diamond film.

13. A method according to claim 12, wherein said step of coating said substrate with a diamond film comprises techniques recited from the group consisting of CVD, combustion synthesis, hot-filament assisted CVD, RF and microwave assisted CVD, DC arc and glow discharge assisted CVD, and laser-assisted CVD.

* * * * *